(12) United States Patent
Liu et al.

(10) Patent No.: US 11,670,643 B2
(45) Date of Patent: Jun. 6, 2023

(54) DRIVING BACKPLANE, DISPLAY PANEL AND DISPLAY DEVICE

(71) Applicant: BOE Technology Group Co., Ltd., Beijing (CN)

(72) Inventors: Dongni Liu, Beijing (CN); Liang Chen, Beijing (CN); Minghua Xuan, Beijing (CN); Haoliang Zheng, Beijing (CN); Qi Qi, Beijing (CN); Jing Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/500,748

(22) Filed: Oct. 13, 2021

(65) Prior Publication Data
US 2022/0302173 A1 Sep. 22, 2022

(30) Foreign Application Priority Data
Mar. 17, 2021 (CN) .......................... 202110284031.4

(51) Int. Cl.
*G09G 3/32* (2016.01)
*G09G 3/34* (2006.01)
*H01L 27/12* (2006.01)
*H01L 25/16* (2023.01)

(52) U.S. Cl.
CPC ............ *H01L 27/124* (2013.01); *G09G 3/32* (2013.01); *G09G 3/3446* (2013.01); *G09G 3/3453* (2013.01); *H01L 25/167* (2013.01); G09G 2300/0426 (2013.01); G09G 2300/0465 (2013.01); G09G 2300/0809 (2013.01)

(58) Field of Classification Search
CPC ...... G09G 3/32; G09G 3/3446; G09G 3/3453; G09G 2300/0426; G09G 2300/0465; G09G 2300/0809; H01L 27/124; H01L 25/167; H01L 33/62
See application file for complete search history.

(56) References Cited

U.S. PATENT DOCUMENTS

| | | | | |
|---|---|---|---|---|
| 11,171,159 | B2 * | 11/2021 | Niu ..................... | H01L 29/7869 |
| 11,320,700 | B2 * | 5/2022 | Li ...................... | G02F 1/133322 |
| 11,342,390 | B2 * | 5/2022 | Xia ..................... | H01L 51/5284 |
| 11,355,056 | B2 * | 6/2022 | Huitema ............... | H01L 27/124 |
| 2021/0248977 | A1 * | 8/2021 | Zhang .................. | H01L 25/167 |
| 2022/0066268 | A1 * | 3/2022 | Li ..................... | G02F 1/133325 |

* cited by examiner

*Primary Examiner* — Vijay Shankar
(74) *Attorney, Agent, or Firm* — IPro, PLLC (57) ABSTRACT

A driving backplane, a display panel and a display device are disclosed. The driving backplane includes: a base substrate; a plurality of pixel driving circuits located on the base substrate; an electrode located on a side of each of the pixel driving circuits facing away from the base substrate and coupled with the pixel driving circuits; and a potential wire located between the electrode and the base substrate and coupled with the pixel driving circuits. Every at least two pixel driving circuits are coupled with a same signal line through a multiplexing controller, an orthographic projection of the controller on the base substrate completely falls into a range of a corresponding micro light emitting diode bonding region, and an orthographic projection of a control wire coupled with the controller on the base substrate completely falls into a range of an orthographic projection of the potential wire on the base substrate.

17 Claims, 4 Drawing Sheets

DRIVING BACKPLANE, DISPLAY PANEL AND DISPLAY DEVICE

CROSS-REFERENCE TO RELATED APPLICATIONS

The present disclosure claims priority to Chinese Patent Application No. 202110284031.4, filed with the China National Intellectual Property Administration on Mar. 17, 2021, the content of which is incorporated herein by reference in its entirety.

FIELD

The present disclosure relates to the technical field of display, and particularly to a driving backplane, a display panel and a display device.

BACKGROUND

A Micro light-emitting diode (Micro LED) technology is a technology that uses a high-density Micro LED array as a display pixel array to realize image display. Each pixel can be addressed and driven individually to emit light. The Micro LED technology has the advantages of high brightness, low power consumption, small size, ultra-high resolution and color saturation and the like. Similar to an organic light-emitting diode (OLED), the Micro LED also has self-luminescence. Compared with the OLED, the Micro LED has higher efficiency and longer life, a material of the Micro LED is not easily affected by an environment, and thus the Micro LED is relatively stable, and a sticking image phenomenon can be avoided.

For existing full-color Micro LED display, a driving backplane needs to be fabricated first, driving electrodes are led out on the driving backplane, and then RGB LED light emitting chips are respectively transferred on the driving electrodes and are driven to emit light according to a certain timing to achieve color display. Since an aperture ratio of Micro LED display mainly depends on the electrodes bonded with the LED chips, VDD/VSS wires, pixel circuits, gate lines, and data lines, the LED chips and the pixel circuits in the existing Micro LED display are generally arranged for partitions, wires coupled with the LED chips and the pixel circuits are generally laid out separately, which reduces a pixel aperture ratio to a certain extent, and transmittance of the driving backplane is low.

SUMMARY

The present disclosure provides a driving backplane, a display panel and a display device.

In a first aspect, an embodiment of the present disclosure provides a driving backplane, including: a base substrate; a plurality of pixel driving circuits located on the base substrate; an electrode located on a side of each of the pixel driving circuits facing away from the base substrate and coupled with the pixel driving circuits, where the electrode is located in a micro light emitting diode bonding region; and a potential wire located between the electrode and the base substrate and coupled with the pixel driving circuits. Every at least two pixel driving circuits are coupled with a same signal line through a multiplexing controller, an orthographic projection of the multiplexing controller on the base substrate completely falls into a range of a corresponding micro light emitting diode bonding region, and an orthographic projection of a control wire coupled with the multiplexing controller on the base substrate completely falls into a range of an orthographic projection of the potential wire on the base substrate.

In a second aspect, an embodiment of the present disclosure provides a display panel, including: the driving backplane, and a light emitting diode bonded to a micro light emitting diode bonding region of the driving backplane.

In a third aspect, an embodiment of the present disclosure provides a display device, including: the display panel.

Description of drawing numerals: 1—base substrate; 2—pixel drive circuit; 3—electrode; 4—potential wire; 5—multiplexing controller; 6—control wire; 11—buffer layer; 21—first planarization layer; 22—first gate layer; 23—first gate insulating layer; 24—active layer; 25—second gate insulating layer; 26—second gate layer; 27—third gate insulating layer; 28—third gate layer; 29—interlayer dielectric layer; 30—source and drain layer; 31—first passivation layer; 32—second passivation layer; 33—third planarization layer; D—data signal line; S—signal line; G—gate signal line; 7—gate control circuit; Q—light emitting diode; 10—driving backplane; 100—display panel.

DETAILED DESCRIPTION

In order to make the objectives, technical solutions, and advantages of embodiments of the present disclosure clearer, the technical solutions of embodiments of the present disclosure will be described clearly and completely with reference to the accompanying drawings of embodiments of the present disclosure. Obviously, the described embodiments are part of embodiments of the present disclosure, rather than all of embodiments. In the case of no conflict, embodiments in the present disclosure and the features in embodiments can be combined with each other. Based on the described embodiments of the present disclosure, all other embodiments obtained by those of ordinary skill in the art without creative labor fall within the protection scope of the present disclosure.

Unless otherwise defined, the technical terms or scientific terms used in the present disclosure shall have the general meanings understood by those of ordinary skilled in the art to which the present disclosure belongs. The word "include" or "comprise" and other similar words used in the present disclosure mean that the element or item appearing before the word covers the element or item listed after the word and their equivalents, but does not exclude other elements or items.

It should be noted that the size and shapes of all graphs in the drawings do not reflect the true scale, and only intend to illustrate the content of the present disclosure. The same or similar reference numbers represent the same or similar elements or elements with the same or similar functions from beginning to end.

In the related art, since a pixel current of Micro LED display is about 1000 times that of a pixel circuit of an OLED, high requirements are raised for resistance voltage drop (IR drop) and a width (current resisting density) of a VDD wire or VSS wire in the Micro LED display. Once the IR drop is large, the brightness uniformity of the Micro LED display may be affected. At present, in order to ensure the brightness uniformity of the Micro LED display, metal Cu is generally used as an LED bonding electrode in an upper layer of a pixel driving circuit, and the VDD/VSS wire is also designed. Since the LED chips and the pixel driving circuits in existing Micro LED display are generally arranged for partitions, and the wires coupled with the LED chips and the pixel driving circuits are generally laid out separately, which reduces a pixel aperture ratio to a certain extent, and transmittance of the driving backplane is low.

In view of this, embodiments of the present disclosure provide a driving backplane, a display panel, and a display device, which are configured to increase a pixel aperture ratio and increase transmittance of the driving backplane.

Figure 1:
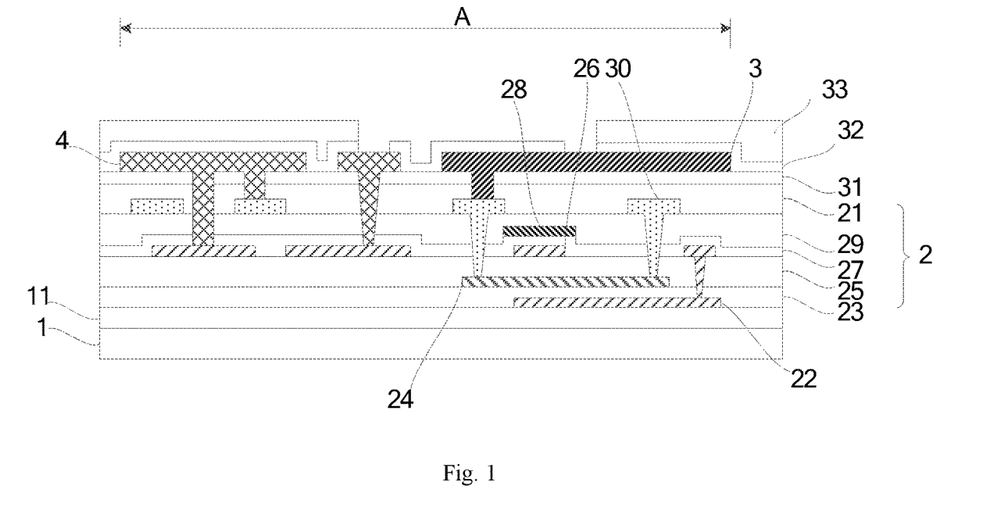
FIG. 1 is a schematic structural diagram of a driving backplane provided by an embodiment of the present disclosure.
Figure 2:
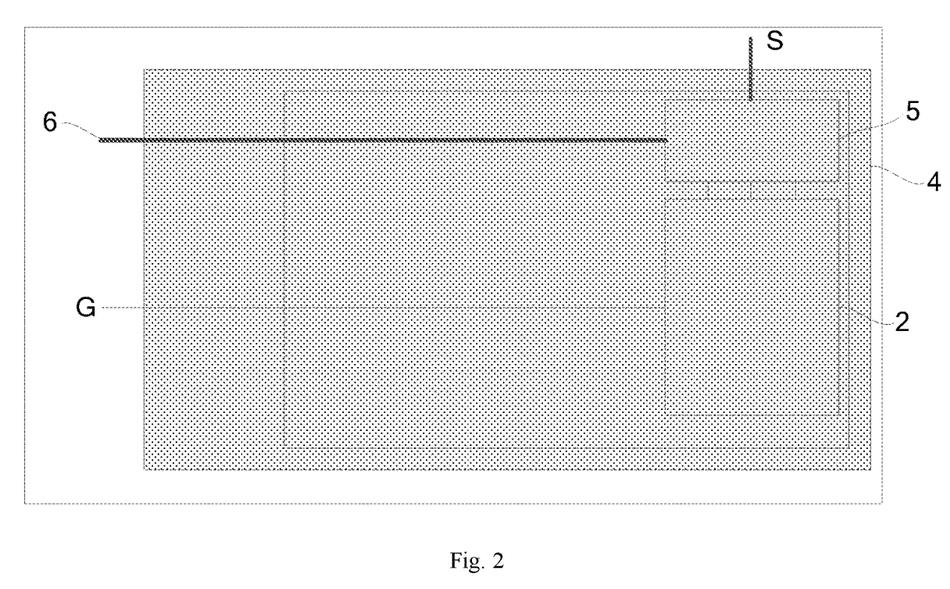
FIG. 2 is a schematic structural diagram of a circuit of the driving backplane shown in FIG. 1.

As shown in FIG. 1 and FIG. 2, FIG. 1 is a schematic structural diagram of a driving backplane provided by an embodiment of the present disclosure, and FIG. 2 a schematic structural diagram of a circuit of the driving backplane shown in FIG. 1. In some embodiments, the driving backplane includes the following parts.

A base substrate 1: in some embodiments, the base substrate 1 may be a glass-based substrate or a silicon-based substrate, which is not limited here.

A plurality of pixel driving circuits 2 located on the base substrate 1: in some embodiments, a pixel driving circuit of the pixel driving circuits 2 may correspond to a red micro light emitting diode bonding region in a pixel region, or may correspond to a green micro light emitting diode bonding region in the pixel region, or may correspond to a blue micro light emitting diode bonding region in the pixel region. The pixel region corresponding to each of the pixel driving circuits 2 may be set according to actual application needs, which is not limited here. In addition, a structure of each of the pixel driving circuits 2 is the same as a related design in the related art, and detailed description is not made here.

An electrode 3 located on a side of each of the pixel driving circuits 2 facing away from the base substrate 1 and coupled with the pixel driving circuits 2, where the electrode 3 is located in a micro light emitting diode bonding region: in some embodiments, the electrode 3 may be located in the red micro light emitting diode bonding region, or may be located in the green micro light emitting diode bonding region, or may be located in the blue micro light emitting diode bonding region, which is not limited here.

A potential wire 4 located between the electrode 3 and the base substrate 1 and coupled with the pixel driving circuits 2: in some embodiments, the potential wire 4 coupled with the pixel driving circuits 2 may be a high potential wire, or may be a low potential wire, where the high potential wire may be configured to communicate a VDD signal, and the low potential wire may be configured to communicate a VSS signal, to realize communication of different functional signals.

Every at least two pixel driving circuits 2 are coupled with a same signal line through a multiplexing controller 5, an orthographic projection of the multiplexing controller 5 on the base substrate 1 completely falls into a range of a corresponding micro light emitting diode bonding region, and an orthographic projection of a control wire 6 coupled with the multiplexing controller 5 on the base substrate 1 completely falls into a range of an orthographic projection of the potential wire 4 on the base substrate 1.

In some embodiments, every at least two pixel driving circuits 2 may be coupled with the same data signal line D, or may be coupled with the same gate signal line G through one multiplexing controller 5, so a proportion of the signal line in all the wires is lowered. In combination with one of the schematic structural diagrams of the driving backplane shown in FIG. 2, every at least two pixel driving circuits 2 is coupled with the same signal line S through the multiplexing controller 5. In addition, the orthographic projection of the multiplexing controller 5 on the base substrate 1 completely falls into the range of the corresponding micro light emitting diode bonding region, so the multiplexing controller 5 and the corresponding micro light emitting diode bonding region are designed to be superimposed. In addition, the orthographic projection of the control wire 6 coupled with the multiplexing controller 5 on the base substrate 1 completely falls into the range of the orthographic projection of the potential wire 4 on the base substrate 1. For example, the control wire 6 coupled with the multiplexing controller 5 is arranged blow a high potential wire 4. For another example, the control wire 6 coupled with the multiplexing controller 5 is arranged blow a low potential wire 4. Therefore, the control wire 6 coupled with the multiplexing controller 5 and the potential wire 4 coupled with the pixel driving circuits 2 are designed to be superimposed, so a pixel aperture ratio is increased, transmittance of the driving backplane is improved, and display quality is guaranteed.

As shown in FIG. 1, in an embodiment of the present disclosure, a structure of the driving backplane may include a buffer layer 11 and the pixel driving circuits 2 which are laminated on the base substrate 1 in sequence, and a first planarization layer 21 which is arranged on a side of each of the pixel driving circuits 2 facing away from the base substrate 1, where the electrode is arranged on the first planarization layer 21. Each of the pixel driving circuits 2 includes electrical elements such as thin film transistors and capacitors. Each of the pixel driving circuits 2 may include a first gate layer 22, a first gate insulating layer 23, an active layer 24, a second gate insulating layer 25, a second gate layer 26, a third gate insulating layer 27, a third gate layer 28, and an interlayer dielectric layer 29 which are laminated in sequence facing away from the base substrate 1, and a source and drain layer 30 which is arranged on a side of the interlayer dielectric layer 29 facing away from the base substrate 1 and is electrically connected with the active layer 24. The driving backplane further includes a first passivation layer 31 arranged on a side of the first planarization layer 21 facing away from the base substrate 1 and a second passivation layer 32 covering a region between electrodes 3. The driving backplane further includes a second planarization layer 33 arranged on a side of the second passivation layer 32 facing away from the base substrate 1. The second gate layer 26 and the third gate layer 28 form a storage capacitor, the electrode 3 may be a structure made of Cu, the first passivation layer 31 and the second passivation layer 32 are configured to prevent external water and oxygen from oxidizing the electrode 3 and the potential wire 4, and the electrode 3 and the second passivation layer 32 may be formed at the same time through a one-time mask patterning process, to simplify a fabricating process of the driving backplane.

Figure 3:
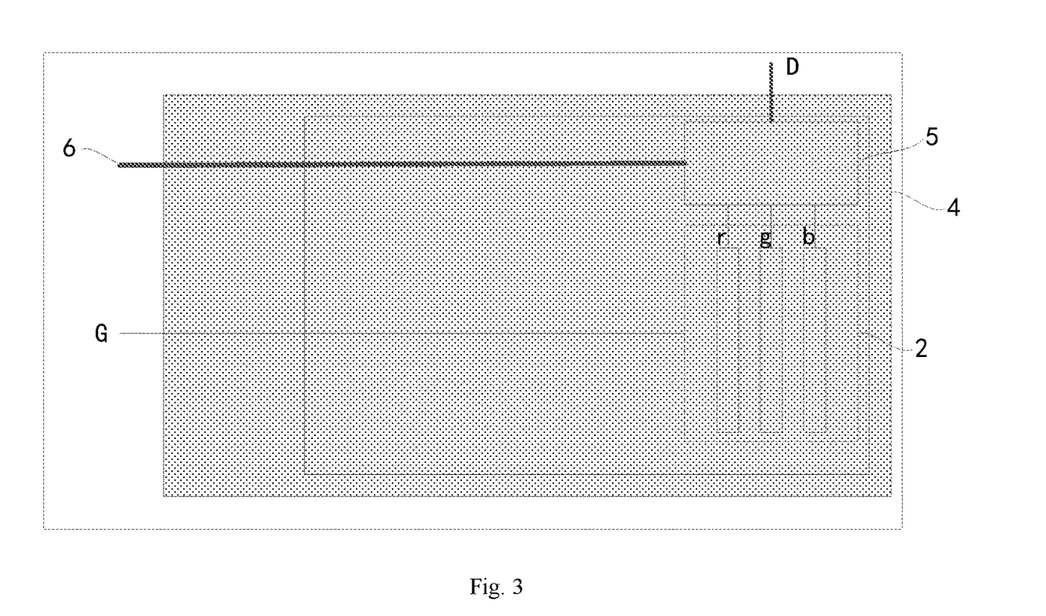
FIG. 3 is a schematic structural diagram of one of circuits of the driving backplane provided by an embodiment of the present disclosure.

FIG. 3 is a schematic structural diagram of one of circuits of the driving backplane provided by an embodiment of the present disclosure. In some embodiments, every three pixel driving circuits 2 are coupled with a same data signal line D through one multiplexing controller 5, and the potential wire 4 extends in a direction perpendicular to the data signal line D. For example, a pixel driving circuit r configured to drive a red micro light emitting diode corresponding to a red micro light emitting diode bonding region, a pixel driving circuit g configured to drive a green micro light emitting diode corresponding to a green micro light emitting diode bonding region, and a pixel driving circuit b configured to drive a blue micro light emitting diode corresponding to a blue micro light emitting diode bonding region in a pixel region are coupled with the same data signal line D through the same multiplexing controller 5. Compared with the situation that existing three pixel drive circuits corresponding to three micro light emitting diode bonding regions of different colors in the same pixel region need to be coupled through three data lines, a proportion of the data signal line D in all the wires is lowered, the pixel aperture ratio is increased, and the transmittance of the driving backplane is increased. In addition, the potential wire 4 extends in the direction perpendicular to the data signal line D. In this way, the control wire 6 coupled with the multiplexing controller 5 and the potential wire 4 extending in the direction perpendicular to the data signal line D may be arranged to be superimposed. In an actual application, the control wire 6 is arranged below the potential wire 4 extending in the direction perpendicular to the data signal line D, so the pixel aperture ratio is increased, and the transmittance of the driving backplane is increased.

Figure 4:
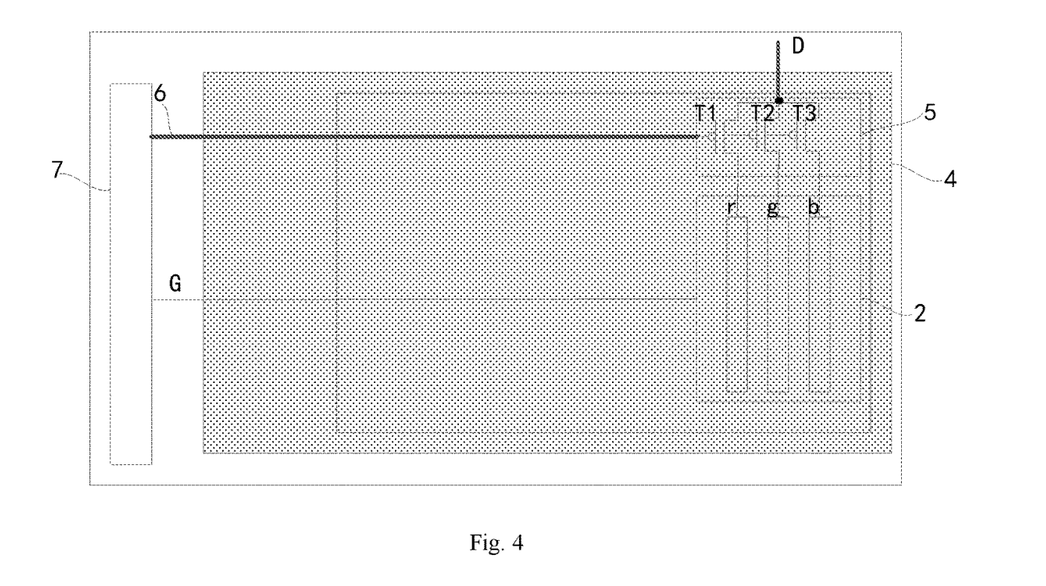
FIG. 4 is a schematic structural diagram of one of circuits of the driving backplane provided by an embodiment of the present disclosure.

In an embodiment of the present disclosure, FIG. 4 is a schematic structural diagram of one of circuits of the driving backplane provided by an embodiment of the present disclosure. In some embodiments, the multiplexing controller 5 includes three switching transistors, where first electrodes of the switching transistors are coupled with the data signal line D, second electrodes of the switching transistors are respectively coupled with data signal input ends of corresponding pixel driving circuits 2, and gates of the switching transistors are respectively coupled with different control wires 6.

As shown in FIG. 4, the multiplexing controller 5 includes a first switching transistor T1, a second switching transistor T2, and a third switching transistor T3. The first electrodes of the switching transistors are coupled with the data signal line D, the second electrodes of the switching transistors are respectively coupled with the data signal input ends of the corresponding pixel driving circuits 2, the gates of the switching transistors are respectively coupled with different control wires 6, and the control wires 6 are respectively coupled with a signal output end of a gate control circuit 7, where the gate control circuit 7 is generally composed of a plurality of cascaded shifting registers. In some embodiments, by arranging the multiplexing controller 5 in a pixel, the three switching transistors respectively output a data signal required by the red micro light emitting diode, a data signal required by the green micro light emitting diode, and a data signal required by the blue light emitting diode. Then, the output data signals are respectively output to the pixel driving circuit r corresponding to the red micro light emitting diode bonding region, the pixel driving circuit g corresponding to the green micro light emitting diode bonding region, and the pixel driving circuit b corresponding to the blue micro light emitting diode bonding region, to guarantee normal display of each of the micro light emitting diodes, and guarantee the display quality.

In some embodiments, according to a signal flow direction, the first electrode of each of the switching transistors may serve as a source, and correspondingly, the second electrode may serve as a drain. Alternatively, the first electrode may serve as the drain, and correspondingly, the second electrode may serve as the source, which is not limited here.

In an embodiment of the present disclosure, the three pixel driving circuits 2 coupled with the same multiplexing controller 5 respectively correspond to the three micro light emitting diode bonding regions of different colors in one pixel region. For example, a first pixel driving circuit 2 coupled with the same multiplexing controller 5 corresponds to a red micro light emitting diode bonding region in a pixel region A, a second pixel driving circuit 2 coupled with the same multiplexing controller 5 corresponds to a green micro light emitting diode bonding region in the pixel region A, and a third pixel driving circuit 2 coupled with the same multiplexing controller 5 corresponds to a blue micro light emitting diode bonding region in the pixel region A. That is, the multiplexing controller 5 may be arranged to be superimposed with the red micro light emitting diode bonding region, the multiplexing controller 5 may be arranged to be superimposed with the green micro light emitting diode bonding region, and the multiplexing controller 5 may be arranged to be superimposed with the blue micro light emitting diode bonding region. For example, when the multiplexing controller 5 includes the three switching transistors, the switching transistors may be respectively arranged to be superimposed with the micro light emitting diode bonding regions of different colors in the pixel region A. Therefore, while the proportion of the data signal line D in all the wires is lowered, the pixel aperture ratio is increased, the transmittance of the driving backplane is increased, and the display quality is guaranteed.

Figure 5:
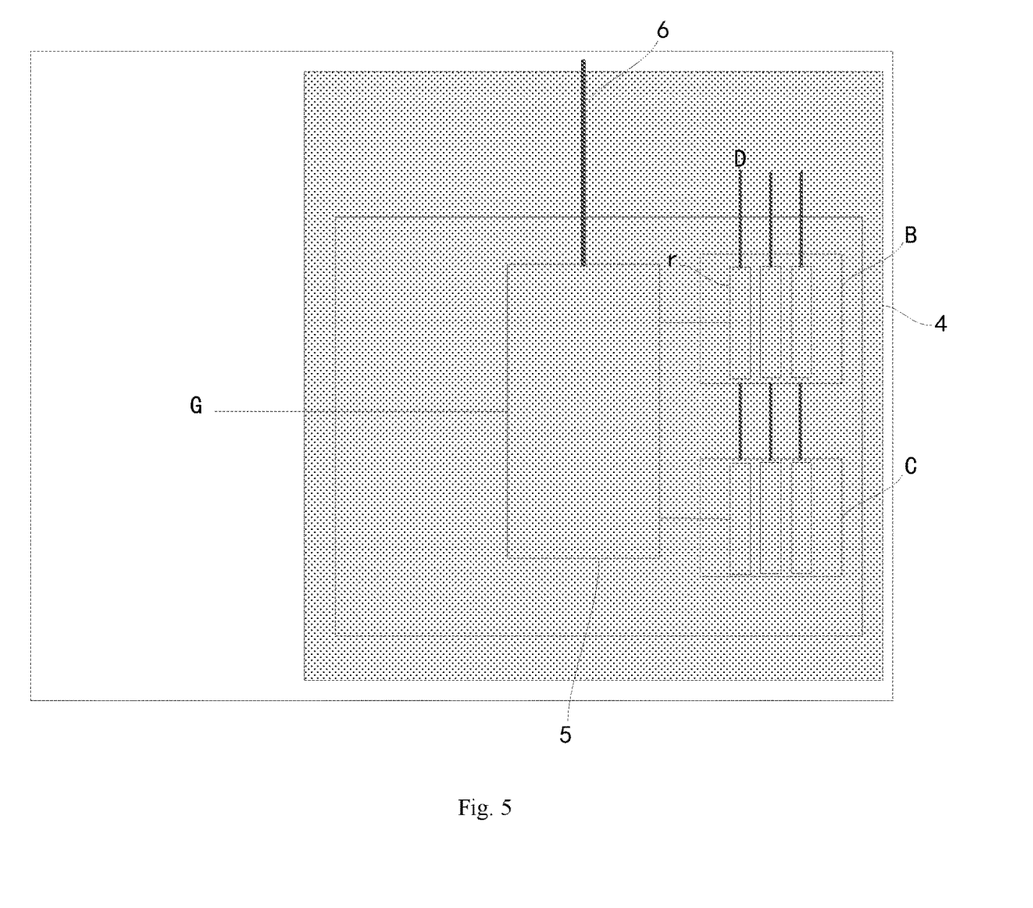
FIG. 5 is a schematic structural diagram of one of circuits of the driving backplane provided by an embodiment of the present disclosure.

In an embodiment of the present disclosure, FIG. 5 is a schematic structural diagram of one of circuits of the driving backplane. In some embodiments, every two pixel driving circuits 2 are coupled with a same gate signal line G through one multiplexing controller 5, and the potential wire 4 extends in a direction perpendicular to the gate signal line G. For example, a pixel driving circuit configured to drive a red micro light emitting diode corresponding to a red micro light emitting diode bonding region in a pixel region B, and a pixel driving circuit configured to drive a red micro light emitting diode corresponding to a red micro light emitting diode bonding region in a pixel region C are coupled with the same gate signal line G through the multiplexing controller 5. Compared with a situation that two pixel driving circuits corresponding to micro light emitting diode bonding regions of the same color in two existing rows of pixel regions need to be coupled through two gate signal lines G, the proportion of the gate signal line G in all the wires is lowered, the pixel aperture ratio is increased, and the transmittance of the driving backplane is increased. In addition, the potential wire 4 extends in the direction perpendicular to the gate signal line G. In this way, the control wire 6 coupled with the multiplexing controller 5 may be arranged to be superimposed with the potential wire 4 extending in the direction perpendicular to the gate signal line G. In an actual application, the control wire 6 is arranged blow the potential wire 4 extending in the direction perpendicular to the gate signal line G, so the pixel aperture ratio is increased, and the transmittance of the driving backplane is increased.

Figure 6:
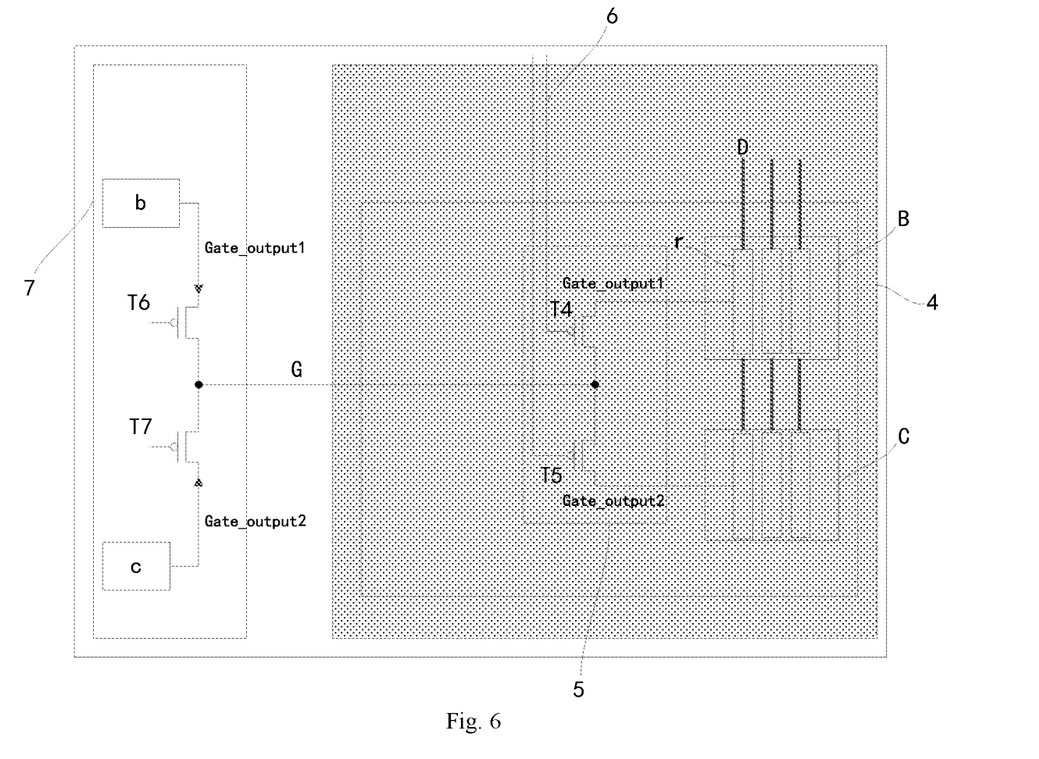
FIG. 6 is a schematic structural diagram of another circuit of the driving backplane provided by an embodiment of the present disclosure.

In an embodiment of the present disclosure, FIG. 6 is a schematic structural diagram of another circuit of the driving backplane. In some embodiments, the multiplexing controller 5 includes two switching transistors, where first electrodes of the switching transistors are coupled with the gate signal line G, second electrodes of the switching transistors are respectively coupled with gate signal input ends of corresponding pixel driving circuits 2, and gates of the switching transistors are respectively coupled with different control wires 6. In some embodiments, each of the switching transistors may be a Thin Film Transistor (TFT) or may be a Metal Oxide Semiconductor (MOS), which is not limited here.

As shown in FIG. 6, the multiplexing controller 5 includes a fourth switching transistor T4 and a fifth switching transistor T5, the first electrodes of the switching transistor are coupled with the gate signal line G, the second electrodes of the switching transistor are respectively coupled with the gate signal input ends of the corresponding pixel driving circuits 2, the gates of the switching transistors are respectively coupled with different control wires 6, and the control wires 6 are respectively coupled with a signal output end of a gate control circuit 7, where the gate control circuit 7 is generally composed of a plurality of cascaded shifting registers. In addition, in some embodiments, as shown in FIG. 6, switching transistors respectively coupled with shifting registers coupled with each row of the pixel driving circuits 2 are further arranged in a region corresponding to the gate control circuit 7. For example, a Gate_output1 signal is output through a shifting register b coupled with the pixel region B, a Gate_output2 signal is output through a shifting register c coupled with the pixel region C, the Gate_output1 signal and the Gate_output2 are combined into a set of signals through a sixth switching transistor T6 and a seventh switching transistor T7 arranged on the gate control circuit 7 and are coupled into the pixel through the same gate signal line G. The gate signal line G enters the pixel and then passes through the fourth switching transistor T4 and the fifth switching transistor T5 to divide the combined set of signals into the Gate_output1 signal and the Gate_output2 signal again, the Gate_output1 signal is input to the pixel driving circuit corresponding to the pixel region B, and the Gate_output2 signal is input to the pixel driving circuit corresponding to the pixel region C, to reduce the proportion of the gate signal line G in all the wires, ensure normal display of a micro light-emitting diode in a micro light emitting diode bonding region in the pixel region, and guarantee the display quality. In addition, since the gate control circuit 7 is generally arranged in a bonding region of the driving backplane, even if the gate control circuit 7 is added with the related design of the sixth transistor T6 and the seventh transistor T7, the pixel aperture ratio is not affected.

In some embodiments, the multiplexing controller 5 is arranged in the pixel, the two switching transistors respectively output gate signals required by the red micro light emitting diodes in the pixel region B and the pixel region C, and then the output data signals are respectively output to the pixel driving circuit corresponding to the red micro light emitting diode bonding region in the pixel region B and the pixel driving circuit corresponding to the red micro light emitting diode bonding region in the pixel region C, so normal display of all the micro light emitting diodes is guaranteed and the display quality is guaranteed.

In some embodiments, each of the switching transistors may be a Thin Film Transistor (TFT) or may be a Metal Oxide Semiconductor (MOS), which is not limited here. According to a signal flow direction, a first electrode of each of the switching transistors may serve as a source, and correspondingly, a second electrode may serve as a drain. Alternatively, the first electrode may serve as the drain, and correspondingly, the second electrode may serve as the source, which is not limited here.

In an embodiment of the present disclosure, the two pixel driving circuits 2 coupled with the same multiplexing controller 5 respectively correspond to the micro light emitting diode bonding regions of the same color in the two pixel regions. For example, the first pixel driving circuit 2 coupled with the same multiplexing controller 5 corresponds to the red micro light emitting diode bonding region in the pixel region B, and the second pixel driving circuit 2 coupled with the same multiplexing controller 5 corresponds to the red micro light emitting diode bonding region in the pixel region C. That is, the multiplexing controller 5 may be arranged to be superimposed with the red micro light emitting diode bonding region in the pixel region B, and the multiplexing controller 5 may further be arranged to be superimposed with the red micro light emitting diode bonding region in the pixel region C. For example, when the multiplexing controller 5 includes the two switching transistors, the switching transistors may be respectively arranged to be superimposed with the red micro light emitting diode bonding region in the pixel region B and the red micro light emitting diode bonding region in the pixel region C. In this way, while the proportion of the gate signal line G in all wires is lowered, the pixel aperture ratio is increased, the transmittance of the driving backplane is increased, and the display quality is guaranteed.

In an embodiment of the present disclosure, the potential wire 4 includes at least one of a low potential wire or a high potential wire. In some embodiments, the control wires 6 may be designed to be superimposed with the high potential wire, or may be designed to be superimposed with the low potential wire. The design may be completed based on actual application needs, which is not limited here. In addition, in some embodiments, the high potential wire may be coupled with a direct current signal end, and the low potential wire may be coupled with another direct current signal end, so control of the driving backplane over the pixel driving circuits 2 is guaranteed, and using performance of the driving backplane is guaranteed.

Figure 7:
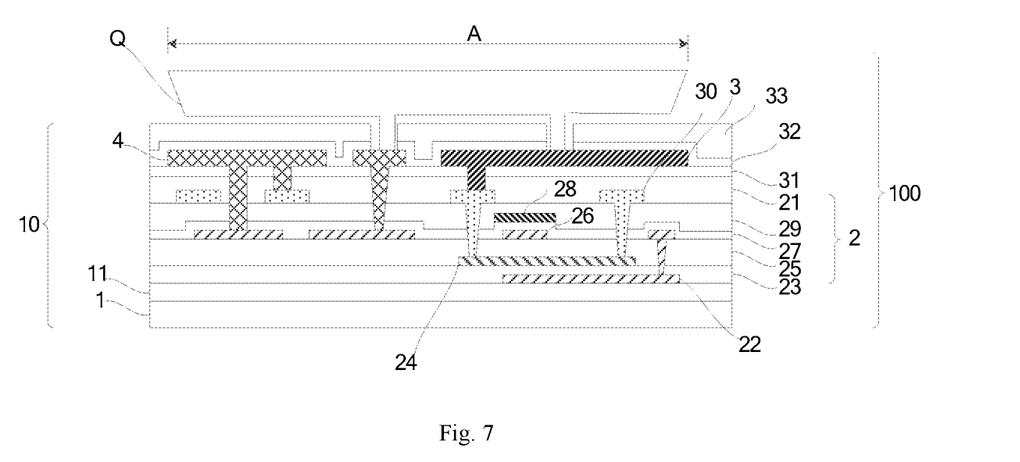
FIG. 7 is one of schematic structural diagrams of a display panel provided by an embodiment of the present disclosure.

Based on the same inventive concept, as shown in FIG. 7, an embodiment of the present disclosure further provides a display panel 100. The display panel 100 includes the driving backplane 10 mentioned above, and a light emitting diode Q bonded to a micro light emitting diode bonding region of the driving backplane 10. The light emitting diode Q may be a red light emitting diode, or may be a green light emitting diode, or may be a blue light emitting diode, which may be arranged according to actual application needs. In addition, a principle of problem solving of the display panel is similar to that of the aforesaid driving backplane, so implementation of the display panel may refer to implementation of the aforesaid driving backplane, and repetition will not be made here.

Based on the same inventive concept, an embodiment of the present disclosure further provides a display device. A principle of problem solving of the display device is similar to that of the aforesaid display panel, so implementation of the display device may refer to implementation of the aforesaid display panel, and repetition will not be made here.

In some embodiments, the display device provided by an embodiment of the present disclosure may be a mobile phone, or may also be any product or component with a display function, such as a tablet computer, a television, a monitor, a notebook computer, a digital photo frame, and a navigating instrument. It should be understood by those of ordinary skilled in the art that the display device should have other indispensable components, which will not be repeated here, and should not be used as a limitation to the present disclosure.

Embodiments of the present disclosure provide the driving backplane, the display panel and the display device. The driving backplane includes the base substrate 1, the plurality of pixel driving circuits 2 located on the base substrate 1, the electrode 3 located on a side of each of the pixel driving circuits 2 facing away from the base substrate 1, located in the micro light emitting diode bonding region and coupled with the pixel driving circuits 2, and the potential wire 4 located between the electrode 3 and the base substrate 1 and coupled with the pixel driving circuits 2. Every at least two pixel driving circuits 2 are coupled with the same signal line through the multiplexing controller 5, the orthographic projection of the multiplexing controller 5 on the base substrate 1 completely falls into the range of the corresponding micro light emitting diode bonding region, the orthographic projection of the control wire 6 coupled with the multiplexing controller 5 on the base substrate 1 completely falls into the range of the orthographic projection of the potential wire 4 on the base substrate 1. That is, the multiplexing controller 5 coupled with every at least two pixel driving circuits 2 through the same signal line is arranged in a pixel, so the proportion of the signal lines in all the wires is lowered. In addition, the multiplexing controller 5 is designed to the superimposed with the corresponding micro light emitting diode bonding region, the control wire 6 coupled with the multiplexing controller 5 is designed to be superimposed with the potential wire 4 coupled with the pixel driving circuits 2, so the pixel aperture ratio is increased, and the transmittance of the driving backplane is increased.

Although embodiments of the present disclosure have been described, those skilled in the art can make additional changes and modifications to these embodiments once they learn the basic creative concept. Therefore, the appended claims are intended to be interpreted as including embodiments and all changes and modifications falling within the scope of the present disclosure.

Obviously, those skilled in the art can make various changes and modifications to the present disclosure without departing from the spirit and scope of the present disclosure. In this way, if these modifications and variations of the present disclosure fall within the scope of the claims of the present disclosure and equivalent technologies, the present disclosure also intends to include these modifications and variations.

What is claimed is:

1. A display device, comprising a display panel, wherein the display panel comprises: a driving backplane, and a light emitting diode bonded to a micro light emitting diode bonding region of the driving backplane, and the driving backplane comprises:
   a base substrate;
   a plurality of pixel driving circuits located on the base substrate;
   an electrode located on a side of each of the pixel driving circuits facing away from the base substrate and coupled with the pixel driving circuits, wherein the electrode is located in a micro light emitting diode bonding region; and
   a potential wire located between the electrode and the base substrate and coupled with the pixel driving circuits; wherein
   every at least two pixel driving circuits are coupled with a same signal line through a multiplexing controller, an orthographic projection of the multiplexing controller on the base substrate completely falls into a range of a corresponding micro light emitting diode bonding region, and an orthographic projection of a control wire coupled with the multiplexing controller on the base substrate completely falls into a range of an orthographic projection of the potential wire on the base substrate.

2. A display panel, comprising: a driving backplane, and a light emitting diode bonded to a micro light emitting diode bonding region of the driving backplane, wherein the driving backplane comprises:
   a base substrate;
   a plurality of pixel driving circuits located on the base substrate;
   an electrode located on a side of each of the pixel driving circuits facing away from the base substrate and coupled with the pixel driving circuits, wherein the electrode is located in the micro light emitting diode bonding region; and
   a potential wire located between the electrode and the base substrate and coupled with the pixel driving circuits; wherein
   every at least two pixel driving circuits are coupled with a same signal line through a multiplexing controller, an orthographic projection of the multiplexing controller on the base substrate completely falls into a range of a corresponding micro light emitting diode bonding region, and an orthographic projection of a control wire coupled with the multiplexing controller on the base substrate completely falls into a range of an orthographic projection of the potential wire on the base substrate.

3. The display panel according to claim 2, wherein every three pixel driving circuits are coupled with a same data signal line through the multiplexing controller, and the potential wire extends in a direction perpendicular to the data signal line.

4. The display panel according to claim 3, wherein the multiplexing controller comprises three switching transistors, first electrodes of the switching transistors are coupled with the data signal line, second electrodes of the switching transistors are respectively coupled with data signal input ends of corresponding pixel driving circuits, and gates of the switching transistors are respectively coupled with different control wires.

5. The display panel according to claim 3, wherein the three pixel driving circuits coupled with the same multiplexing controller respectively correspond to three micro light emitting diode bonding regions of different colors in a pixel region.

6. The display panel according to claim 2, wherein every two pixel driving circuits are coupled with a same gate signal line through the multiplexing controller, and the potential wire extends in a direction perpendicular to the gate signal line.

7. The display panel according to claim 6, wherein the multiplexing controller comprises two switching transistors, first electrodes of the switching transistors are coupled with the gate signal line, second electrodes of the switching transistors are respectively coupled with gate signal input ends of corresponding pixel driving circuits, and gates of the switching transistors are respectively coupled with different control wires.

8. The display panel according to claim 6, wherein the two pixel driving circuits coupled with the same multiplexing controller respectively correspond to micro light emitting diode bonding regions of a same color in two pixel regions.

9. The display panel according to claim 2, wherein the potential wire comprises at least one of a low potential wire or a high potential wire.

10. A driving backplane, comprising:
a base substrate;
a plurality of pixel driving circuits located on the base substrate;
an electrode located on a side of each of the pixel driving circuits facing away from the base substrate and coupled with the pixel driving circuits, wherein the electrode is located in a micro light emitting diode bonding region; and
a potential wire located between the electrode and the base substrate and coupled with the pixel driving circuits; wherein
every at least two pixel driving circuits are coupled with a same signal line through a multiplexing controller, an orthographic projection of the multiplexing controller on the base substrate completely falls into a range of a corresponding micro light emitting diode bonding region, and an orthographic projection of a control wire coupled with the multiplexing controller on the base substrate completely falls into a range of an orthographic projection of the potential wire on the base substrate.

11. The driving backplane according to claim 10, wherein every three pixel driving circuits are coupled with a same data signal line through the multiplexing controller, and the potential wire extends in a direction perpendicular to the data signal line.

12. The driving backplane according to claim 11, wherein the multiplexing controller comprises three switching transistors, first electrodes of the switching transistors are coupled with the data signal line, second electrodes of the switching transistors are respectively coupled with data signal input ends of corresponding pixel driving circuits, and gates of the switching transistors are respectively coupled with different control wires.

13. The driving backplane according to claim 11, wherein the three pixel driving circuits coupled with the same multiplexing controller respectively correspond to three micro light emitting diode bonding regions of different colors in a pixel region.

14. The driving backplane according to claim 10, wherein every two pixel driving circuits are coupled with a same gate signal line through the multiplexing controller, and the potential wire extends in a direction perpendicular to the gate signal line.

15. The driving backplane according to claim 14, wherein the multiplexing controller comprises two switching transistors, first electrodes of the switching transistors are coupled with the gate signal line, second electrodes of the switching transistors are respectively coupled with gate signal input ends of corresponding pixel driving circuits, and gates of the switching transistors are respectively coupled with different control wires.

16. The driving backplane according to claim 14, wherein the two pixel driving circuits coupled with the same multiplexing controller respectively correspond to micro light emitting diode bonding regions of a same color in two pixel regions.

17. The driving backplane according to claim 10, wherein the potential wire comprises at least one of a low potential wire or a high potential wire.

* * * * *